United States Patent
Bartling et al.

(12)

(10) Patent No.: US 10,637,494 B2
(45) Date of Patent: Apr. 28, 2020

(54) ADC SELF-TEST USING TIME BASE AND CURRENT SOURCE

(71) Applicant: Microchip Technology Incorporated, Chandler, AZ (US)

(72) Inventors: James E. Bartling, Chandler, AZ (US); Stephen Bowling, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 16/176,170

(22) Filed: Oct. 31, 2018

(65) Prior Publication Data

US 2019/0131993 A1 May 2, 2019

Related U.S. Application Data

(60) Provisional application No. 62/580,549, filed on Nov. 2, 2017.

(51) Int. Cl.
| | | |
|---|---|---|
| *H03M 1/10* | (2006.01) | |
| *H03M 1/12* | (2006.01) | |
| *G01R 23/00* | (2006.01) | |
| *G01R 31/28* | (2006.01) | |
| *H03M 1/00* | (2006.01) | |
| *H03M 1/06* | (2006.01) | |

(52) U.S. Cl.
CPC ......... *H03M 1/1071* (2013.01); *H03M 1/109* (2013.01); *G01R 23/00* (2013.01); *G01R 31/2834* (2013.01); *H03M 1/00* (2013.01); *H03M 1/06* (2013.01); *H03M 1/10* (2013.01); *H03M 1/1009* (2013.01); *H03M 1/12* (2013.01)

(58) Field of Classification Search
CPC ........ H03M 1/10; H03M 1/1009; H03M 1/06; H03M 1/12; H03M 1/00; G01R 23/00; G01R 31/2834
USPC ........ 341/120, 118, 155, 157; 324/607, 73.1
See application file for complete search history.

(56) References Cited

U.S. PATENT DOCUMENTS

| | | | |
|---|---|---|---|
| 4,808,853 A | * | 2/1989 | Taylor ................ H03K 19/0005 326/119 |
| 6,518,900 B1 | | 2/2003 | Oehler et al. ................ 341/120 |

(Continued)

OTHER PUBLICATIONS

Azaïs, F. et al., "A Low-Cost Adaptive Ramp Generator for Analog BIST Applications," IEEE Proceedings on VLSI Test Symposium, pp. 266-271, Apr. 29, 2001.

(Continued)

*Primary Examiner* — Joseph J Lauture
(74) *Attorney, Agent, or Firm* — Slayden Grubert Beard PLLC

(57) ABSTRACT

A constant current source, a stable time base and a capacitor are used to self-check operation of an analog-to-digital convertor (ADC) by charging the capacitor for a pre-determined amount of time to produce a voltage thereon. This voltage will be proportional to the amount of time that the capacitor was charged. Multiple points on the ADC transfer function can be verified in this self-check procedure simply by varying the amount of time for charging of the capacitor. Relative accuracy among test points may then be easily obtained. Absolute accuracy may be obtained by using an accurate clock reference for the time base, a known current source and capacitor value.

17 Claims, 2 Drawing Sheets

(56) References Cited

U.S. PATENT DOCUMENTS 8,390,384 B1 * 3/2013 Daryanani .............. H03L 1/026
                                                          331/111
2010/0253559 A1 10/2010 Dasnurkar ................... 341/121

OTHER PUBLICATIONS

Khatri, R. et al., "An ADC BIST with On-Chip Ramp Generator," International Journal of Electronics, vol. 94, No. 12, pp. 1121-1135, Dec. 1, 2007.
Dasnurkar, Sachin D. et al., "Real-Time Dynamic Hybrid BiST Solution for Very-Low-Cost ATE Production Testing of A/D Converters with Controlled DPPM," $18^{th}$ International Symposium on Quality Electronic Design, pp. 562-569, Mar. 22, 2010.
International Search Report and Written Opinion, Application No. PCT/US2018/058615, 18 pages, dated Feb. 28, 2019.

* cited by examiner

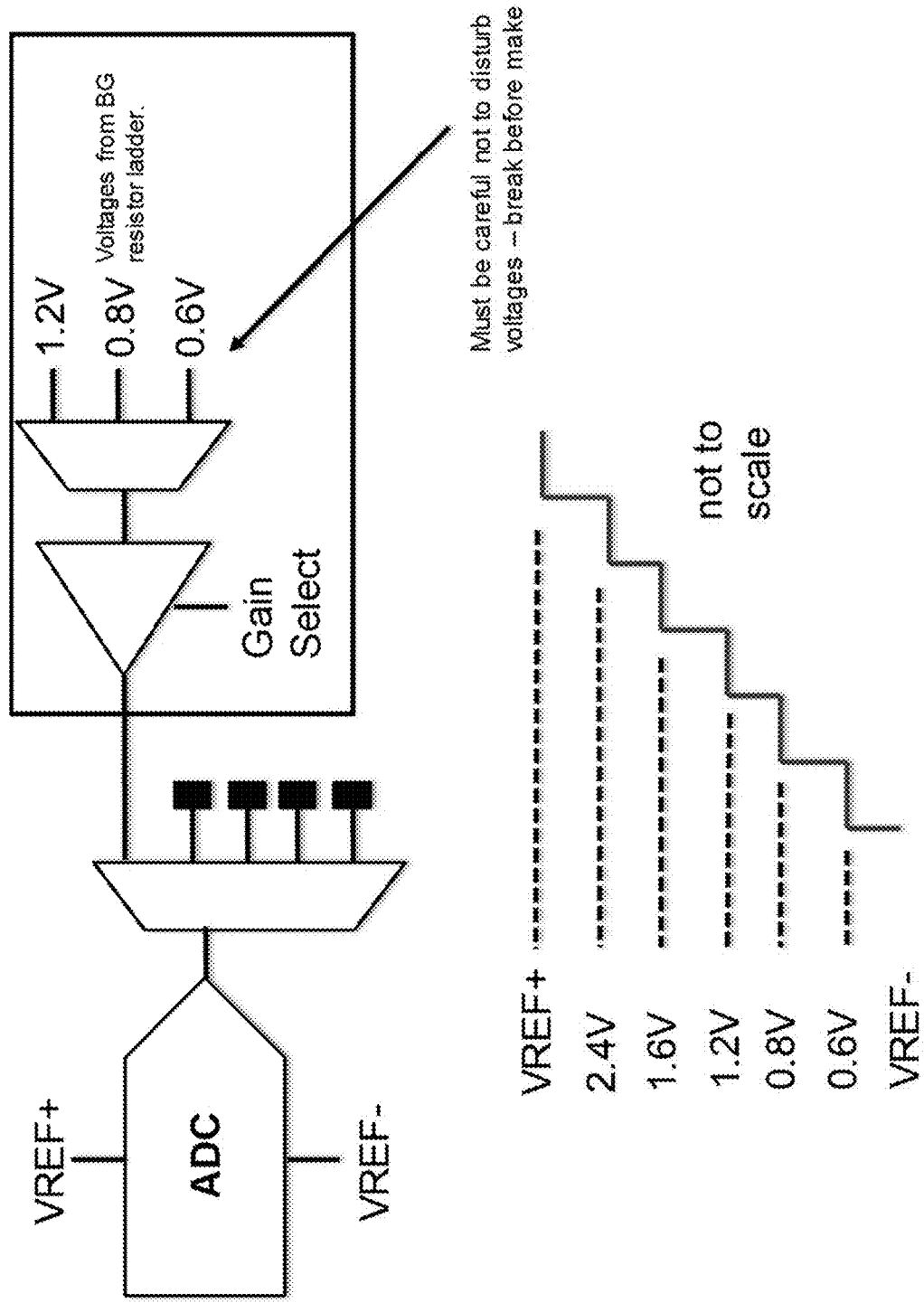
FIGURE 2 (Prior Technology)

US 10,637,494 B2

ADC SELF-TEST USING TIME BASE AND CURRENT SOURCE

RELATED PATENT APPLICATION

This application claims priority to commonly owned U.S. Provisional Patent Application Ser. No. 62/580,549; filed Nov. 2, 2017; entitled "ADC Self-Test Using Time Base and Current," by James E. Bartling and Stephen Bowling, and is hereby incorporated by reference herein for all purposes.

TECHNICAL FIELD

The present disclosure relates to analog-to-digital (ADC) converters and, more particularly, to an ADC self-test using a time base and a current source.

BACKGROUND

Functional safety of systems requires verification of equipment used for monitoring those systems. Monitoring equipment typically is digitally based, e.g., microcontrollers and microprocessors, but monitor analog parameters. This requires analog-to-digital conversion which typically is performed with an analog-to-digital converter (ADC). However, it is important that functional testing of the ADC be performed in the analog domain, e.g., analog inputs produce the correct digital outputs from the ADC. Also, the linearity of the ADC should be verified during the functional testing thereof. Thus, multiple voltage points may be used to confirm correct ADC transfer function. Verification of correct digital outputs from known reference voltages are desired.

FIG. 2 illustrations a prior technology schematic block diagram and graph for ADC self-testing using external voltage references. This is both complex and expensive since a number of voltage references, operational amplifiers and multiplexers must be used. Care must be taken in ensuring that the voltage references stay calibrated and the multiplexer switching does not distort or affect values of the voltage references.

SUMMARY

Therefore, what is needed is an accurate, fast, reliable and low-cost way of generating test voltages for verifying operation of an ADC.

According to an embodiment, a method for self-testing an analog-to-digital converter (ADC) may comprise the steps of: coupling a constant current source to a discharged capacitor for a time period; converting a voltage on the capacitor after the time period to a digital value with the ADC; and comparing the digital value from the ADC to the voltage on the capacitor represented by the equation $V = I/C*t$, where V may be the voltage on the capacitor, I may be the constant current, C may be the capacitance of the capacitor and t may be the time period.

According to a further embodiment of the method, may comprise the steps of: a) setting the time period to a minimum time; b) discharging the capacitor; c) coupling the capacitor for the time period to the constant current source having a current value I; d) converting the voltage on the capacitor to a digital value with the ADC after the time period ends; e) storing the digital value of that time period in a memory; f) ending the testing of the ADC when the time period may be equal to or greater than a maximum time then going to step i); g) increasing the time period to a longer time; h) returning to step b); and i) determining ADC accuracy by evaluating the stored digital values.

According to a further embodiment of the method, the step of determining ADC linearity may comprise the steps of comparing the stored digital values with the respective time periods multiplied by the current value I and divided by a capacitance C of the capacitor. According to a further embodiment of the method, may comprise the step of evaluating the stored digital values to determine ADC linearity.

According to a further embodiment of the method, may comprise the steps of: a) setting the time period to a maximum time; b) discharging the capacitor; c) coupling the capacitor for the time period to the constant current source having a current value I; d) converting the voltage on the capacitor to a digital value with the ADC after the time period ends; e) storing the digital value of that time period in a memory; f) ending the testing of the ADC when the time period may be less than or equal to a minimum time then going to step i); g) decreasing the time period to a shorter time; h) returning to step b); and i) determining ADC accuracy by evaluating the stored digital values.

According to a further embodiment of the method, the step of determining ADC accuracy may comprise the steps of comparing the stored digital values with the respective time periods multiplied by the current value I and divided by a capacitance C of the capacitor. According to a further embodiment of the method, may comprise the step of evaluating the stored digital values to determine ADC linearity.

According to another embodiment, an apparatus to self-test an analog-to-digital converter (ADC) may comprise: a constant current source; a capacitor; a first switch operable to short out a charge on the capacitor; a second switch operable to couple the constant current source to the capacitor; an ADC having an input coupled to the capacitor; and a control circuit having a timer; wherein the control circuit may close the first switch thereby shorting out any charge on the capacitor, may open the first switch and close the second switch thereby coupling the constant current source to the capacitor, and may open the second switch after a time period determined by the timer; and a memory for storing a digital representation from an output of the ADC of a voltage on the capacitor after the second switch opens.

According to a further embodiment, the memory may store a plurality of digital representations of respective voltages on the capacitor generated by a plurality of different time periods. According to a further embodiment, the second switch may be a tri-state output of the constant current source. According to a further embodiment, the timer may be programmable for generating different time periods. According to a further embodiment, a high accuracy clock may be coupled to the timer for generating a precision time period.

According to yet another embodiment, a system for self-testing an analog-to-digital converter (ADC) may comprise: a clock; a control circuit having a timer and coupled to the clock; a microprocessor coupled to the control circuit; a memory coupled to the microprocessor; a constant current source; a capacitor; a first switch controlled by the control circuit and operable to short out a charge on the capacitor; a second switch controlled by the control circuit and operable to couple the constant current source to the capacitor; and an ADC having an input coupled to the capacitor and an output coupled to the microprocessor; wherein the control circuit may close the first switch thereby shorting out any charge on the capacitor, may open the first switch and may close the second switch thereby coupling the constant current source to the capacitor, and may open the second switch after a time period determined by the timer; and the microprocessor may store in the memory a digital representation from the ADC of a voltage on the capacitor after the second switch opens.

According to a further embodiment, the second switch may be a tri-state output of the constant current source. According to a further embodiment, the system may comprise a microcontroller. According to a further embodiment, the timer may be programmable for generating different time periods. According to a further embodiment, the clock may be a high accuracy clock for generating a precision time period.

BRIEF DESCRIPTION OF THE DRAWINGS

A more complete understanding of the present disclosure may be acquired by referring to the following description taken in conjunction with the accompanying drawings wherein:

FIG. 2 illustrations a prior technology schematic block diagram and graph for ADC self-testing using external voltage references.

Figure 1:
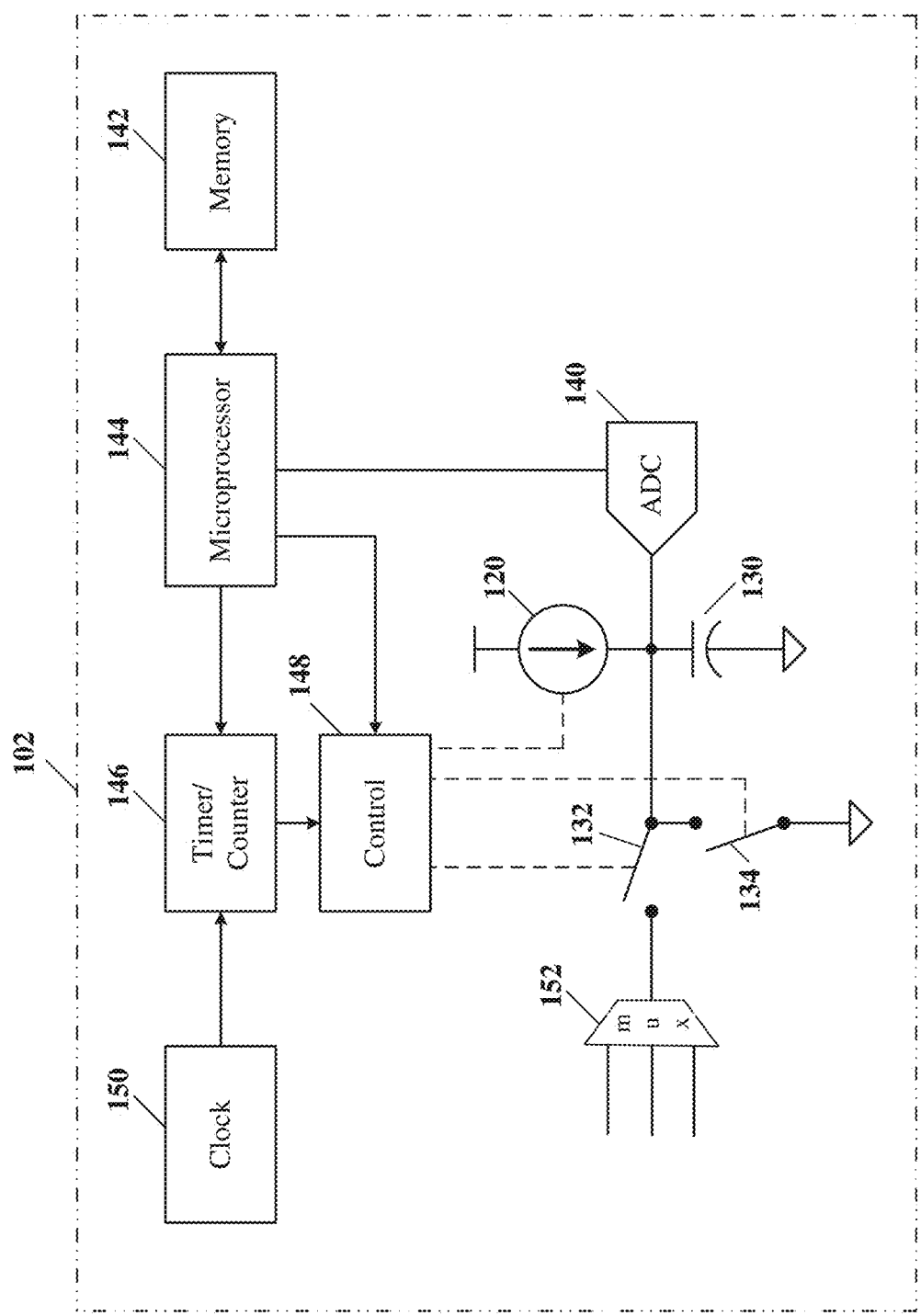
FIG. 1 illustrations a schematic block diagram for ADC self-test without use of external references, according to embodiments of the present disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the forms disclosed herein.

DETAILED DESCRIPTION

Example aspects of the present disclosure are described below in conjunction with FIG. 1, which shows a simple, low cost circuit for ADC self-test without the use of external voltage references. Embodiments of the present disclosure are directed to self-checking an ADC against more than one voltage reference for functional safety of the circuit using the ADC.

In specific example embodiments of this disclosure, a constant current source, a stable time base and a capacitor may be used to self-check operation of an ADC by charging the capacitor for a pre-determined amount of time to produce a voltage thereon. This voltage will be proportional to the amount of time that the capacitor was charged. Multiple points on the ADC transfer function can be verified in this self-check procedure simply by varying the amount of time for charging of the capacitor. Relative accuracy among test points may then be easily obtained. Absolute accuracy may be obtained by using an accurate clock reference for the time base, a known current source and capacitor value.

A typical microcontroller has at least one ADC, an associated sample and hold (S/H) circuit that comprises a S/H capacitor and sampling switches. The microcontroller will also have timers, clock and constant current sources available for use in a circuit for self-checking one or more ADC(s). Therefore, no external components or circuits are required for the ADC self-test (check) procedure, according to specific example embodiments of this disclosure.

At the beginning of the ADC self-test procedure, the control logic closes a switch across the ADC S/H capacitor to discharge it and then opens the switch to allow the ADC S/H capacitor to be charged. Then a S/H charging switch may couple a constant current source to the S/H capacitor for a pre-determined time period. A tristate output of the constant current source may be used instead of the S/H charging switch. A clock source, timer (used as a time base) and control logic may be used to close the S/H charging switch for the pre-determined time period. The voltage on the S/H capacitor will be proportional to the period of time that the constant current source is coupled to the S/H capacitor. Once the time period is up, the S/H charging switch is opened, and the ADC can do an analog-to-digital conversion on the voltage on the S/H capacitor. This process is repeated multiple times as the charging time is varied. The ADC conversion sequences may be examined for linear responses, which may then verify that the ADC conversions are working properly. Multiple analog voltage points may be generated by just varying the time period used to charge the S/H capacitor to the specific analog voltage points. Then after the analog-to-digital conversions are done, confirmation of correct ADC transfer functions may be verified.

Referring now to the drawings, the details of example embodiments are schematically illustrated. Like elements in the drawings will be represented by like numbers, and similar elements will be represented by like numbers with a different lower-case letter suffix.

FIG. 1 illustrations a schematic block diagram for ADC self-test without use of external references, according to embodiments of the present disclosure. A microcontroller 102 may comprise a clock 150, a timer 146, a control circuit 148, a microprocessor 144, a memory 142, an analog-to-digital converter (ADC) 140, a sample and hold (S/H) capacitor 130, a constant current source 120 that may have a tristate output, a first switch 132, a second switch 134 and a multiplexer 152. All of the aforementioned circuits may be provided in the microcontroller 102. The timer 146 may be a counter that counts clock pulses from the clock 150 and issues an action when a desired count is reached. The timer 146 may be programmable for generating different time periods. The microprocessor 144 may program the count value into the timer 146.

The constant current source 120, providing a current I, may be coupled to the S/H capacitor 130 by enabling its tri-state output or with a switch (not shown). The S/H capacitor 130, having a capacitance C, may be charged for a predetermined time period t. The timer 146 and clock 150 may be used to generate the time period t. C and I are constant, wherein:

$$\Delta V_{cap} = \frac{I}{C} t$$

Therefore, the voltage on the S/H capacitor 130 is directly proportional to the time period t in which the constant current source 120 is coupled to and charges the S/H capacitor 130. For providing a full-scale range for a 3 volt, 12-bit ADC, typical values for I, C and t may be, for example but are not limited to, C=5 pF, I=1 µA and t=7.5 µs (microseconds) resulting in a voltage on the S/H capacitor 120 of 1.5 volts. This provides a Δt=0.2 v/µs using C=5 pF and I=1 µA. For a 3 volt 12-bit ADC, a one-bit resolution would require approximately 4 ns (nanoseconds)/bit. Therefore, depending on the clock speed and accuracy thereof a self-test and linearity check of the ADC operation can be easily performed using existing internal circuits of a typical microcontroller and without requiring any external connections or circuits.

A plurality of voltages having different values may be generated by using different time periods. These plurality of voltages may be converted to a plurality of digital representations thereof and stored in the memory 142. The plurality of digital representations may be processed with the microprocessor for determining accuracy and/or linearity of the ADC conversion process.

Embodiments of the present disclosure may use a current source already available on a die package, semiconductor device, microcontroller, or other suitable electronic device. Embodiments of the present disclosure may easily check any point of the ADC transfer function. Relative linearity checks may be performed to any desired resolution. Absolute accuracy checks depend on accuracy of the clock source and timer resolution.

The present invention has been described in terms of one or more preferred embodiments, and it should be appreciated that many equivalents, alternatives, variations, and modifications, aside from those expressly stated (e.g., methods of manufacturing, product by process, and so forth), are possible and within the scope of the invention. It should be understood, however, that the description herein of specific example embodiments is not intended to limit the disclosure to the particular forms disclosed herein.

What is claimed is:

1. A method for self-testing an analog-to-digital converter (ADC) in a microcontroller comprising a processor, said method comprising the steps of:
    coupling a constant current source to a discharged capacitor for a time period;
    converting a voltage on the capacitor after the time period to a digital value with the ADC;
    comparing by the processor the digital value from the ADC to the voltage on the capacitor represented by the equation $V=I/C*t$, where V is the voltage on the capacitor, I is the constant current, C is the capacitance of the capacitor and t is the time period, and
    repeating said previous steps for different time periods and determine proper operation of the ADC by the processor when the digital values provided by the ADC produce a linear response.

2. The method according to claim 1, further comprising the steps of:
    a) setting the time period to a minimum time;
    b) discharging the capacitor;
    c) coupling the capacitor for the time period to the constant current source having a current value I;
    d) converting the voltage on the capacitor to a digital value with the ADC after the time period ends;
    e) storing the digital value of that time period in a memory;
    f) ending the testing of the ADC when the time period is equal to or greater than a maximum time then going to step i);
    g) increasing the time period to a longer time;
    h) returning to step b); and
    i) determining ADC accuracy by evaluating the stored digital values.

3. The method according to claim 2, wherein the step of determining ADC linearity comprises the steps of comparing the stored digital values with the respective time periods multiplied by the current value I and divided by a capacitance C of the capacitor.

4. The method according to claim 2, further comprising the step of evaluating the stored digital values to determine ADC linearity.

5. The method according to claim 1, further comprising the steps of:
    a) setting the time period to a maximum time;
    b) discharging the capacitor;
    c) coupling the capacitor for the time period to the constant current source having a current value I;
    d) converting the voltage on the capacitor to a digital value with the ADC after the time period ends;
    e) storing the digital value of that time period in a memory;
    f) ending the testing of the ADC when the time period is less than or equal to a minimum time then going to step i);
    g) decreasing the time period to a shorter time;
    h) returning to step b); and
    i) determining ADC accuracy by evaluating the stored digital values.

6. The method according to claim 5, wherein the step of determining ADC accuracy comprises the steps of comparing the stored digital values with the respective time periods multiplied by the current value I and divided by a capacitance C of the capacitor.

7. The method according to claim 5, wherein the capacitor has a value of 5 picofarad and the current source generates a current of 1 uA.

8. An apparatus to self-test an analog-to-digital converter (ADC), comprising:
    a constant current source;
    a capacitor;
    a first switch operable to short out a charge on the capacitor;
    a second switch operable to couple the constant current source to the capacitor;
    an ADC having an input coupled to the capacitor; and
    a control circuit having a timer;
    wherein the control circuit is configured to generate a voltage on the capacitor by:
        closing the first switch thereby shorting out any charge on the capacitor,
        opening the first switch and closes the second switch thereby coupling the constant current source to the capacitor, and
        opening the second switch after a time period determined by the timer; and
    a memory for storing a digital value from an output of the ADC of a voltage on the capacitor after the second switch opens, wherein the control circuit is configured to repeat generating a voltage on the capacitor for different time periods and respective digital values from the output of the ADC are stored in the memory wherein the apparatus is further configured to determine proper operation of the ADC when the digital values provided by the ADC produce a linear response.

9. The apparatus according to claim 8, wherein the capacitor has a value of 5 picofarad and the current source generates a current of 1 uA.

10. The apparatus according to claim 8, wherein the second switch is a tri-state output of the constant current source.

11. The apparatus according to claim 8, wherein the timer is programmable for generating different time periods.

12. The apparatus according to claim 8, further comprising a high accuracy clock coupled to the timer for generating a precision time period.

13. A microcontroller comprising self-testing functionality of an analog-to-digital converter (ADC) within said microcontroller, said microcontroller comprising:
- a clock;
- a control circuit having a timer and coupled to the clock;
- a microprocessor coupled to the control circuit;
- a memory coupled to the microprocessor;
- a constant current source;
- a capacitor;
- a first switch controlled by the control circuit and operable to short out a charge on the capacitor;
- a second switch controlled by the control circuit and operable to couple the constant current source to the capacitor; and
- an ADC having an input coupled to the capacitor and an output coupled to the microprocessor;
- wherein the control circuit is configured to charge the capacitor by
  - closing the first switch thereby shorting out any charge on the capacitor,
  - opening the first switch and closes the second switch thereby coupling the constant current source to the capacitor, and
  - opening the second switch after a time period determined by the timer; and
- the microprocessor is configured to store in the memory a digital representation from the ADC of a voltage on the capacitor after the second switch opens, wherein the microcontroller is configured to repeat charging the capacitor and storing digital representations of the voltage on the capacitor by the ADC and to determine proper operation of the ADC when the digital representations produce a linear response.

14. The microcontroller according to claim 13, wherein the second switch is a tri-state output of the constant current source.

15. The microcontroller according to claim 13, wherein the capacitor has a value of 5 picofarad and the current source generates a current of 1 uA.

16. The microcontroller according to claim 13, wherein the timer is programmable for generating different time periods.

17. The microcontroller according to claim 13, wherein the clock is a high accuracy clock for generating a precision time period.

* * * * *